United States Patent
Bragin

(10) Patent No.: US 10,234,765 B2
(45) Date of Patent: Mar. 19, 2019

(54) ENERGY CONTROLLER FOR EXCIMER-LASER SILICON CRYSTALLIZATION

(71) Applicant: COHERENT LASERSYSTEMS GMBH & CO. KG, Göttingen (DE)

(72) Inventor: Igor Bragin, Göttingen (DE)

(73) Assignee: COHERENT LASERSYSTEMS GMBH & CO. KG, Göttingen (DE)

( * ) Notice: Subject to any disclaimer, the term of this patent is extended or adjusted under 35 U.S.C. 154(b) by 0 days.

(21) Appl. No.: 15/613,662

(22) Filed: Jun. 5, 2017

(65) Prior Publication Data

US 2018/0348644 A1   Dec. 6, 2018

(51) Int. Cl.
| | | |
|---|---|---|
| *H01L 21/00* | (2006.01) |
| *G03F 7/20* | (2006.01) |
| *H01S 3/134* | (2006.01) |
| *H01S 3/225* | (2006.01) |
| *H01S 3/03* | (2006.01) |
| *H01S 3/038* | (2006.01) |

(52) U.S. Cl.
CPC ...... *G03F 7/70025* (2013.01); *G03F 7/70041* (2013.01); *G03F 7/70216* (2013.01); *G03F 7/70558* (2013.01); *H01S 3/03* (2013.01); *H01S 3/038* (2013.01); *H01S 3/134* (2013.01); *H01S 3/225* (2013.01)

(58) Field of Classification Search
CPC ............ G03F 7/70025; G03F 7/70041; G03F 7/70558; G03F 7/70216; H01S 3/038; H01S 3/03; H01S 3/225; H01S 3/134
USPC ........................................................ 438/487
See application file for complete search history.

(56) References Cited

U.S. PATENT DOCUMENTS

| | | | |
|---|---|---|---|
| 6,005,879 A | 12/1999 | Sandstrom et al. |
| 6,151,349 A | 11/2000 | Gong et al. |
| 6,392,743 B1 | 5/2002 | Zambon et al. |
| 6,727,731 B1 | 4/2004 | Rebhan et al. |
| 6,865,212 B2 | 3/2005 | Kleinschmidt |
| 7,428,039 B2 | 9/2008 | Ferber |
| 7,615,722 B2 | 11/2009 | Govorkov et al. |
| 8,411,354 B2 | 4/2013 | Schill et al. |
| 8,802,580 B2 | 8/2014 | Im |
| 8,995,487 B1 * | 3/2015 | Almonte ............... H01S 5/0428 372/38.02 |

(Continued)

FOREIGN PATENT DOCUMENTS

| | | |
|---|---|---|
| DE | 102006036173 A1 | 2/2008 |
| EP | 0748009 A2 | 12/1996 |

OTHER PUBLICATIONS

International Search Report and Written Opinion received for PCT Patent Application No. PCT/EP2018/064651, dated Sep. 3, 2018, 10 pages.

(Continued)

*Primary Examiner* — Vu A Vu
(74) *Attorney, Agent, or Firm* — Morrison & Foerster LLP

(57) ABSTRACT

Excimer laser annealing apparatus includes and excimer laser delivering laser-radiation pulses to a silicon layer supported on a substrate translated with respect to the laser pulses such that the consecutive pulses overlap on the substrate. The energy of each of the laser-radiation pulses is monitored, transmitted to control-electronics, and the energy of a next laser pulse is adjusted by a high-pass digital filter.

20 Claims, 10 Drawing Sheets

(56) References Cited

U.S. PATENT DOCUMENTS

| | | | |
|---|---|---|---|
| 2005/0059224 A1 | 3/2005 | Im | |
| 2011/0309754 A1* | 12/2011 | Ashdown | H05B 33/0818 315/151 |
| 2013/0034118 A1 | 2/2013 | Bragin et al. | |
| 2013/0100980 A1* | 4/2013 | Abe | H01S 3/134 372/57 |
| 2013/0341310 A1* | 12/2013 | Van Der Wilt | C30B 13/24 219/121.62 |
| 2017/0070024 A1 | 3/2017 | Kawasuji et al. | |

OTHER PUBLICATIONS

Verly, P G., "Fourier Transform Technique With Frequency Filtering For Optical Thin-Film Design", Applied Optics, vol. 34, No. 4, Feb. 1, 1995, pp. 688-694.

* cited by examiner

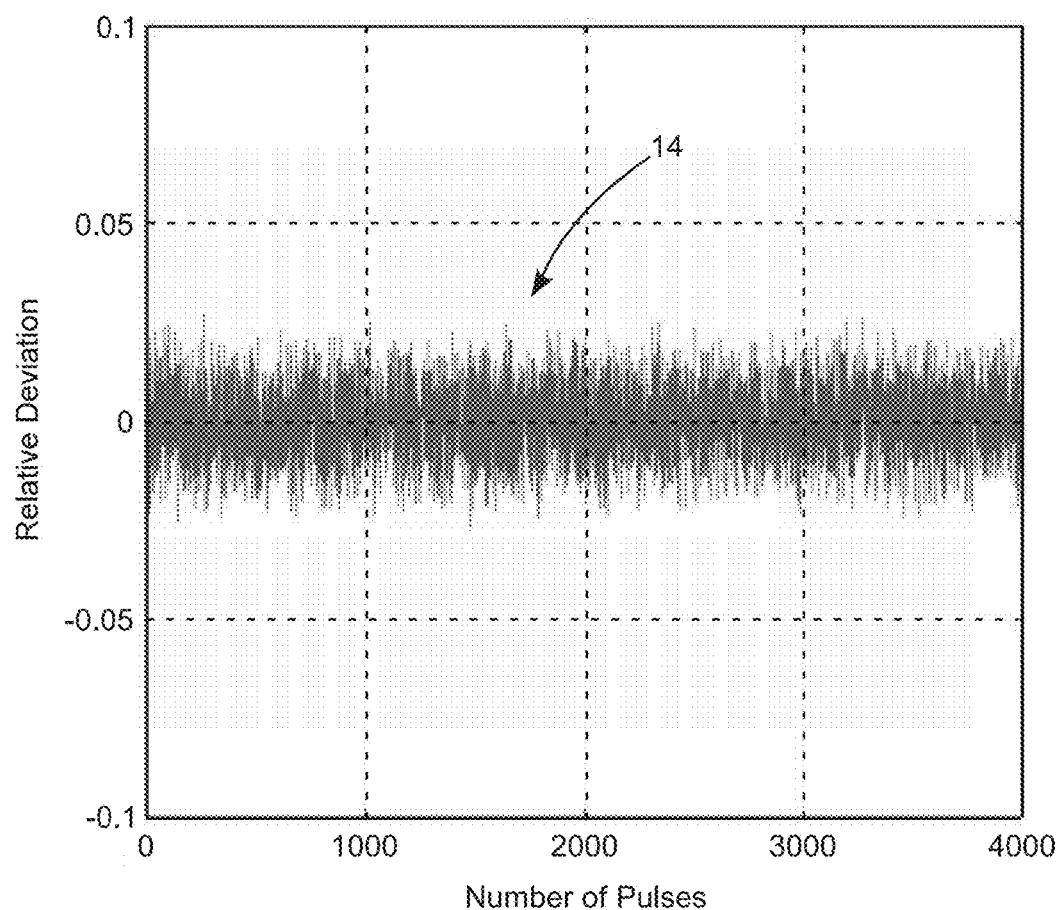
*FIG. 2*
(PriorArt)

ENERGY CONTROLLER FOR EXCIMER-LASER SILICON CRYSTALLIZATION

TECHNICAL FIELD OF THE INVENTION

The present invention relates in general to crystallization of a silicon layer using an excimer-laser beam. The invention relates in particular to repeated melting and crystallization of a silicon layer, by controlled irradiation with consecutive excimer-laser pulses.

DISCUSSION OF BACKGROUND ART

Flat panel displays are an enabling technology for all contemporary portable consumer electronic devices and large-format televisions. Silicon crystallization is a processing step that is often used in the manufacture of thin-film transistor (TFT) active-matrix liquid-crystal displays (AML-CDs) and active-matrix organic light-emitting diode (AMO-LED) displays. Crystalline silicon forms a semiconductor base, in which electronic circuits of the display are formed by conventional lithographic processes.

Commonly, crystallization is performed using a pulsed beam of laser-radiation that is shaped into the form of a long line having a uniform intensity profile along the length direction (long-axis) and a uniform or "top-hat" intensity profile across the width direction (short-axis). In the crystallization process, a thin layer of amorphous silicon (a "silicon film") on a glass substrate is repeatedly melted by the pulsed laser-radiation, while the substrate and the silicon layer thereon are scanned relative to a source and optics delivering the pulsed laser-radiation. Repeated melting and re-solidification (recrystallization) through exposure to the pulsed laser-radiation, at a certain optimum energy-density, take place until a desired crystalline microstructure is obtained in the silicon film.

Optical elements are used to form the pulsed beam of laser-radiation into a long line on the silicon film. Crystallization occurs in a strip having the length and width of the long line of laser-radiation. Every effort is made to keep the intensity of the pulsed laser-radiation highly uniform along the long line. This effort is necessary to keep the crystalline microstructure uniform. A favored source of the pulsed laser-radiation is an excimer laser, which delivers laser-radiation having a wavelength in the ultraviolet region of the electromagnetic spectrum. The above described crystallization process, using excimer-laser pulses, is usually referred to as excimer-laser annealing (ELA).

The process is a delicate one. The error margin for the optimum energy-density can be a few percent or even as small as ±0.5%.

In a typical example of ELA, the "line-length" (long-axis dimension) of the beam is in the range of about 750 millimeters (mm) to 1500 mm. The "line-width" (short-axis dimension) of the beam is about 0.4 mm. The pulsed laser-radiation has a duration of about 50 ns and a pulse repetition frequency of about 500 Hertz (Hz), i.e., the pulses are temporally separated by about 2 milliseconds (ms). A substrate and a silicon layer thereon are scanned perpendicular to the long-axis of the beam at a rate such that any location on the silicon layer is irradiated by about 20 consecutive pulses, thereby recrystallizing the silicon layer. The process is illustrated schematically by FIG. 1A and FIG. 1B.

FIG. 1A schematically illustrates a typical short-axis intensity profile 12 of an above-discussed excimer laser beam. The beam is characterized by a line width W, here, measured between half-maximum intensity points of the intensity profile. The scan direction of a workpiece (a substrate with a silicon layer thereon) being irradiated is indicated by arrow A. FIG. 1B schematically illustrates the above discussed pulse overlapping scheme with any location on the substrate being irradiated by the about 20 consecutive pulses. Methods and apparatus for shaping excimer laser beams are described in U.S. Pat. Nos. 7,615,722 and 7,428,039, assigned to the assignee of the present invention, and the complete disclosures of which are hereby incorporated by reference.

Methods and apparatus for monitoring and controlling output of an excimer laser to about the above-discussed ±0.5% tolerance have been developed and are in use. Nevertheless, there remains a continuing need to improve such methods and apparatus for producing large area crystalline silicon layers with improved manufacturing yield.

SUMMARY OF THE INVENTION

The present invention is directed to apparatus for crystallizing a silicon layer supported on a substrate, by delivering a plurality of laser pulses at a pulse-repetition frequency to the silicon layer along an incident beam path, while translating the substrate with respect to the incident beam path. The laser pulses have an about flat-topped intensity profile and a width in the translation direction. The pulse-repetition frequency is selected cooperative with the substrate translation such that consecutive laser pulses overlap on the substrate. The apparatus comprises a laser-emitter generating and delivering the laser pulses. The laser pulses each have a pulse-energy. Homogenizing and beam-shaping optics are provided and arranged to receive the laser pulses, cause the laser pulses to have the about flat-topped intensity profile, and deliver the flat-topped laser pulses to the substrate. An energizer is provided, which generates and delivers electrical pulses to the laser-emitter for energizing the laser-emitter. The electrical pulses each have an electrical pulse-energy. An energy monitor is provided and arranged to measure the pulse-energy of each laser pulse, deliver the measured pulse-energy to a control circuit, which includes a digital filter. The control circuit is supplied with a preferred set energy level required for the silicon layer crystallization. The control circuit and the digital filter therein are arranged to adjust the electrical pulse-energy for a next pulse to maintain the average pulse energy of the laser pulses at the set energy level and to minimize pulse-energy fluctuations of the laser pulses below a predetermined frequency that is less than the pulse-repetition frequency.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 2 is a graph schematically illustrating relative deviations of laser pulse-energy as a function of pulse-number for a hypothetical excimer laser controlled by prior-art methods.

DETAILED DESCRIPTION OF THE INVENTION

In arriving at the method and apparatus of the present invention, an analysis of prior-art energy control of excimer-laser output was performed. The analysis was performed for a plurality of laser pulses having the profile of FIG. 1A and consecutive laser pulses delivered in the overlapping manner of FIG. 1B. In particular, the effect of such laser-energy control on the stability of the radiation dosage applied to an above-discussed translated silicon layer was performed. A detailed description of this analysis is set forth below with reference to FIG. 2, FIG. 3, FIG. 4, and FIG. 5.

FIG. 2 is a graph schematically illustrating relative deviation of laser pulse-energy from a desired pulse-energy as a function of pulse-number (curve 14) for a hypothetical excimer laser controlled by prior-art methods. The graph was generated mathematically using a random-number generator to simulate pulse-to-pulse energy deviations such that the frequency spectrum of deviations has constant intensity. It was assumed that the laser had a desired pulse-energy of 1000 milli-Joules (mJ), with pulses delivered at a pulse-repetition frequency (PRF) of 500 Hz, i.e. corresponding to a temporal pulse-to-pulse separation of 2 ms. It was also assumed that the standard deviation of the laser pulse-energy from the desired value was 1%.

Figure 3:
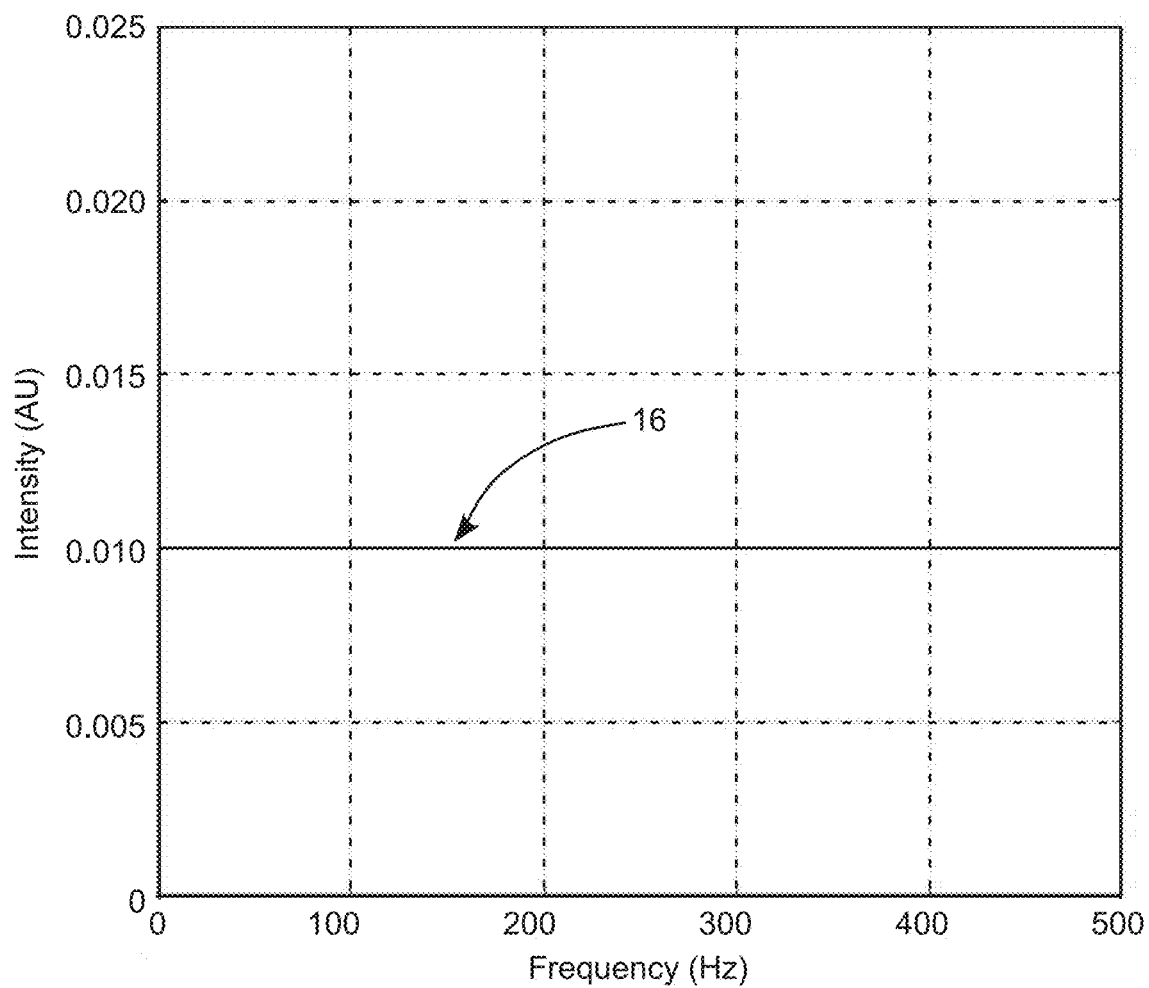
FIG. 3 is a graph schematically illustrating an intensity spectrum of the pulse-energy deviations of FIG. 2, graphically depicting pulse-energy instability of the laser as a function of frequency.

FIG. 3 is a graph schematically illustrating the intensity of the fast Fourier transform (FFT) spectrum for the relative deviation of FIG. 2. This graph provides an indication of pulse-energy instability for the hypothetical laser as a function of frequency (curve 16) up to the laser PRF of 500 Hz. It can be seen, in this instance, that the intensity of the instability is frequency-independent, having the value of 0.01 (1%).

Figure 4:
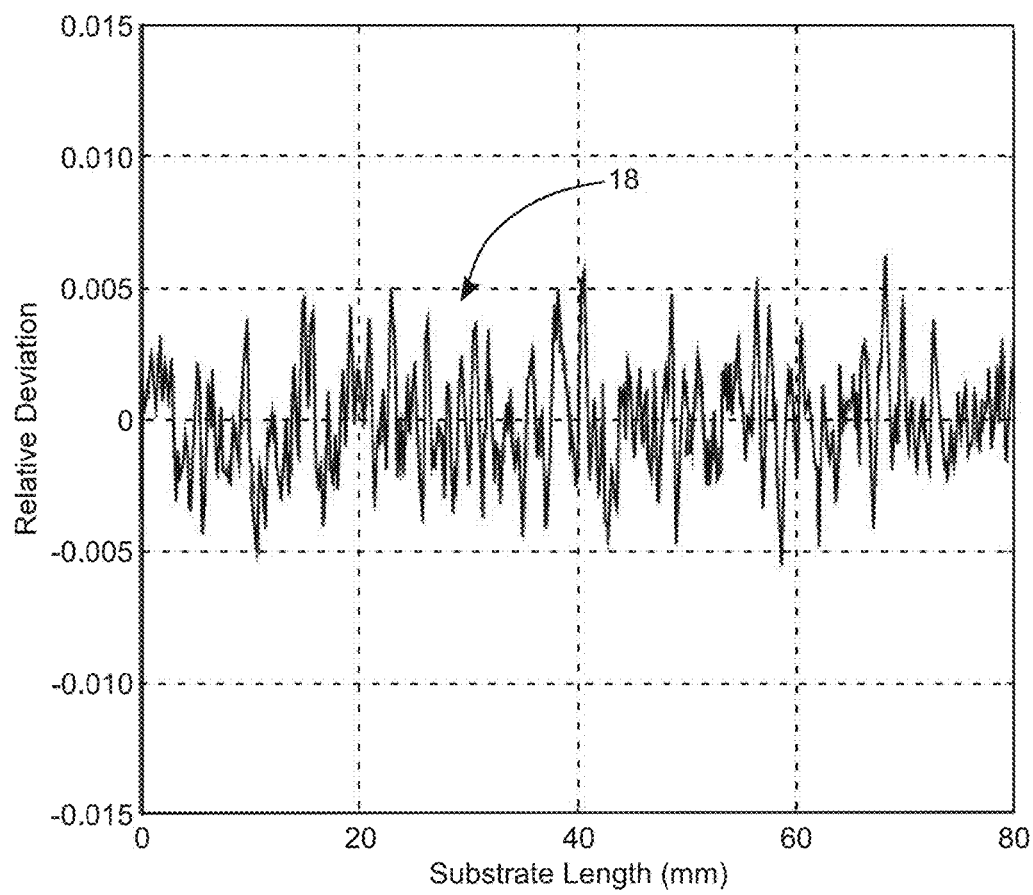
FIG. 4 is a graph of relative deviation of energy-dose on a substrate as a function of length along a substrate for the relative pulse-energy deviations of FIG. 2 for the laser controlled by prior-art methods, with laser pulses having the intensity profile of FIG. 1A delivered in the overlapping manner of FIG. 1B.

In a belief that pulse-energy stability on a translated crystalline silicon layer is most important to the ELA process, the graph of FIG. 2 was transformed into the graph of FIG. 4, which is a graph of energy dose (energy-density) deviation as a function of length along the substrate-supported silicon layer being annealed (curve 18). In this description and claims appended hereto, the terminology "on the substrate" means on a silicon layer supported by the substrate.

Figure 1A:
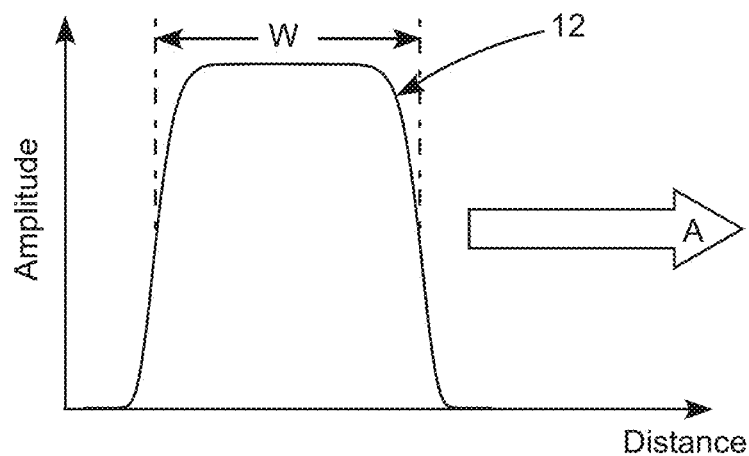
FIG. 1A is a graph schematically illustrating a short axis intensity profile of a typical prior-art excimer-laser pulse used for silicon crystallization.
Figure 1B:
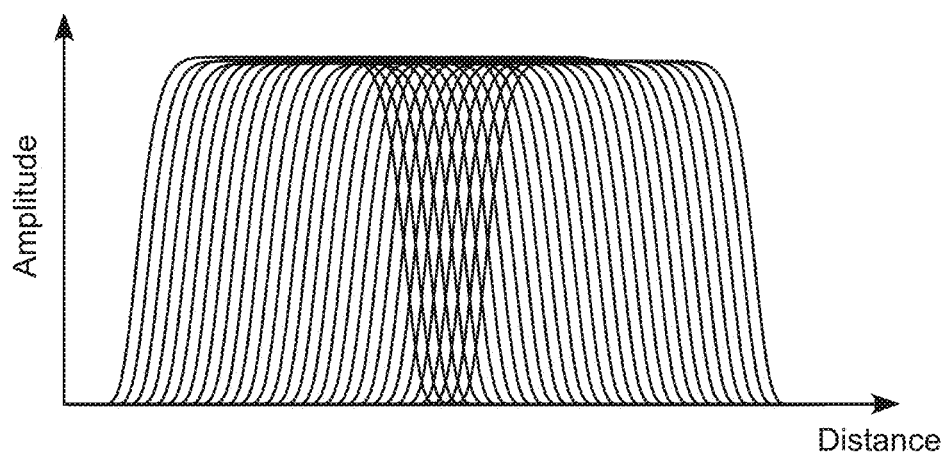
FIG. 1B schematically illustrates a typical prior-art arrangement of consecutively overlapped laser pulses of FIG. 1A.

It was assumed in generating the graph of FIG. 4 that the pulses had the about flat-topped intensity-profile of FIG. 1A and were delivered in the overlapping manner of FIG. 1B. A preferred ELA process would have a width W of the flat-topped intensity profile in the range of about 0.4 mm to about 0.5 mm, a translation speed S of the silicon layer relative to the laser beam in the range of about 5 millimeters-per-second (mm/s) to about 10 mm/s, and irradiate each location on the substrate with 15 to 25 consecutive pulses. In generating FIG. 4, width W was assumed to be 0.5 mm and translation speed S was assumed to be 10 mm/s. The assumed width and translation speed correspond to irradiating each location on the substrate with 25 consecutive pulses. It can be seen in FIG. 4 that the spatial energy-dose deviations are constrained within a range of about ±0.005 (±0.5%), far less than the pulse-to-pulse energy deviations. This is the intended effect of spatially overlapping the individual flat-topped pulses, which leads to averaging the pulse-to-pulse instabilities at each location on the substrate.

Figure 5:
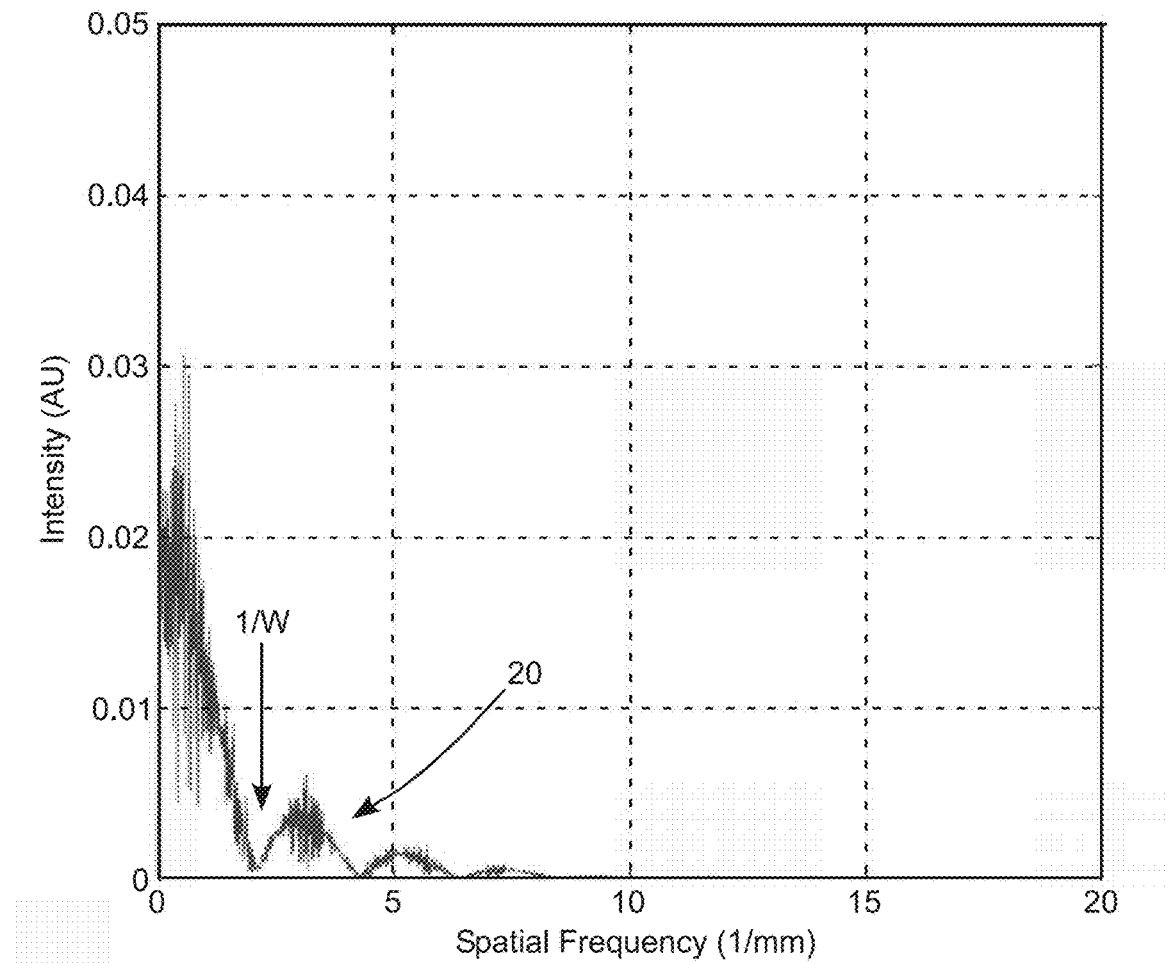
FIG. 5 is a graph schematically illustrating a fast Fourier transform spectrum of the relative energy-dose deviations of FIG. 4, graphically depicting energy-dose variation on the substrate as a function of spatial frequency.

FIG. 5 is a graph schematically illustrating the intensity of a FFT spectrum (curve 20) for the energy-dose deviation of FIG. 4. This graph provides an indication of energy-dose variation on a silicon layer being irradiated as a function of spatial frequency in reciprocal millimeters (1/mm). This variation is strongly dependent on spatial frequency at spatial frequencies less than 10/mm. The biggest contribution to energy-dose variation is at spatial frequencies less than 1/W, which is 2/mm for the assumed value of W. This spatial frequency range corresponds to a temporal frequency range in the pulse-energy instability graph of FIG. 3 of less than 20 Hz. That is, 1/W multiplied by S, which is 2/mm×10 mm/s=20 Hz in this case.

It was hypothesized that if pulse-energy fluctuations having frequencies less than 60 Hz, i.e. less than 3×20 Hz, were filtered out of the FFT spectrum, then energy-dose variation along a silicon layer being crystallized should be significantly reduced. Overall, the silicon layer would have more uniform exposure to the overlapping flat-topped pulses, albeit with a likely increase in pulse-energy instability.

Figure 6:
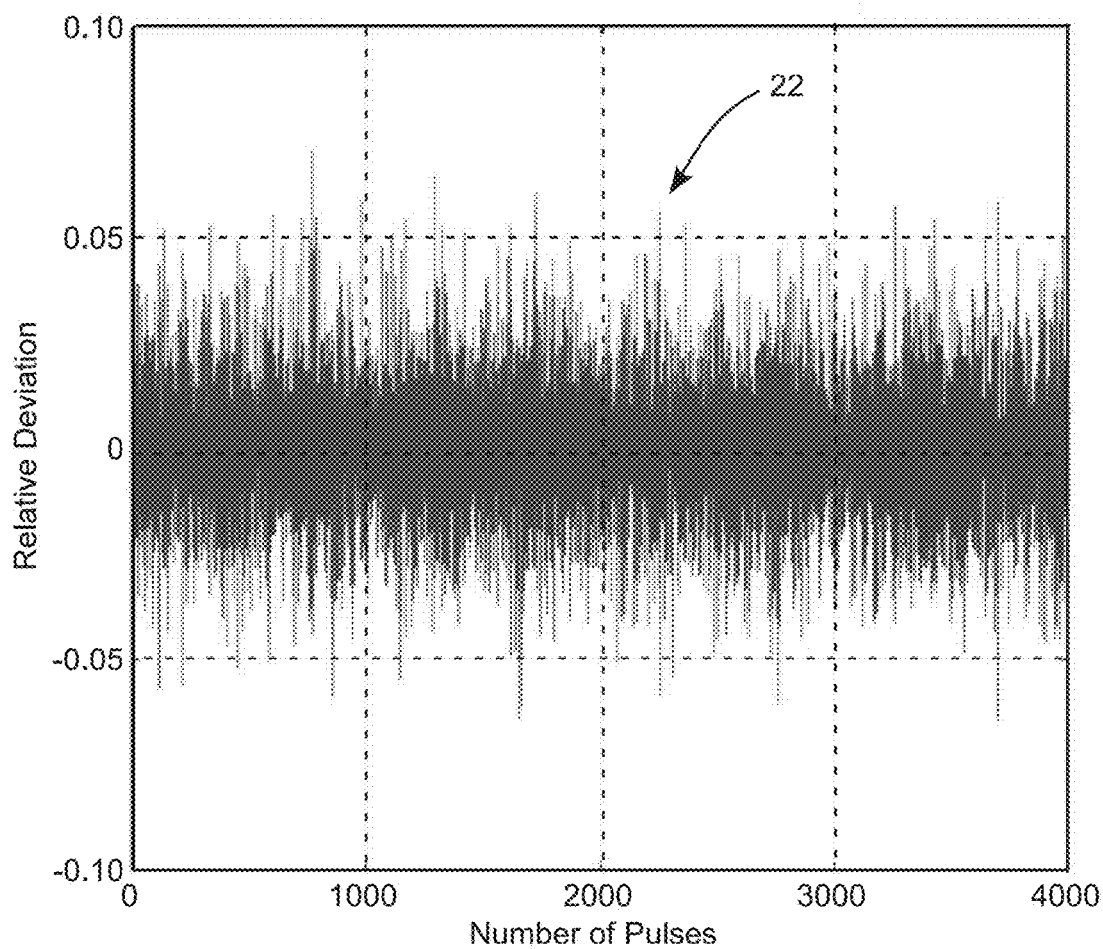
FIG. 6 is a graph schematically illustrating relative fluctuations of laser pulse-energy as a function of pulse-number for a hypothetical excimer laser controlled by a method in accordance with the present invention, wherein low-frequency pulse-energy fluctuations are removed using a high-pass digital filter.

FIG. 6 is a graph schematically illustrating pulse-energy fluctuation as a function of pulse number (curve 22) for the hypothetical laser characterized by FIG. 2, controlled in accordance with the present invention, wherein pulse-energy fluctuations having frequencies lower than about 60 Hz have been removed by a high-pass digital filter. The curve was mathematically generated in a manner similar to that used to generate the graph of FIG. 2, but with data transformed using a high-pass digital filter. In this instance, the digital filter was an elliptical filter of the sixth order. It can be seen that, as a result of the high-pass digital filtering, the largest pulse-energy fluctuations are greater than in the unfiltered case of FIG. 2. The standard deviation of the fluctuations in FIG. 6 is about 1.9%, compared with 1% in the unfiltered case.

Figure 7:
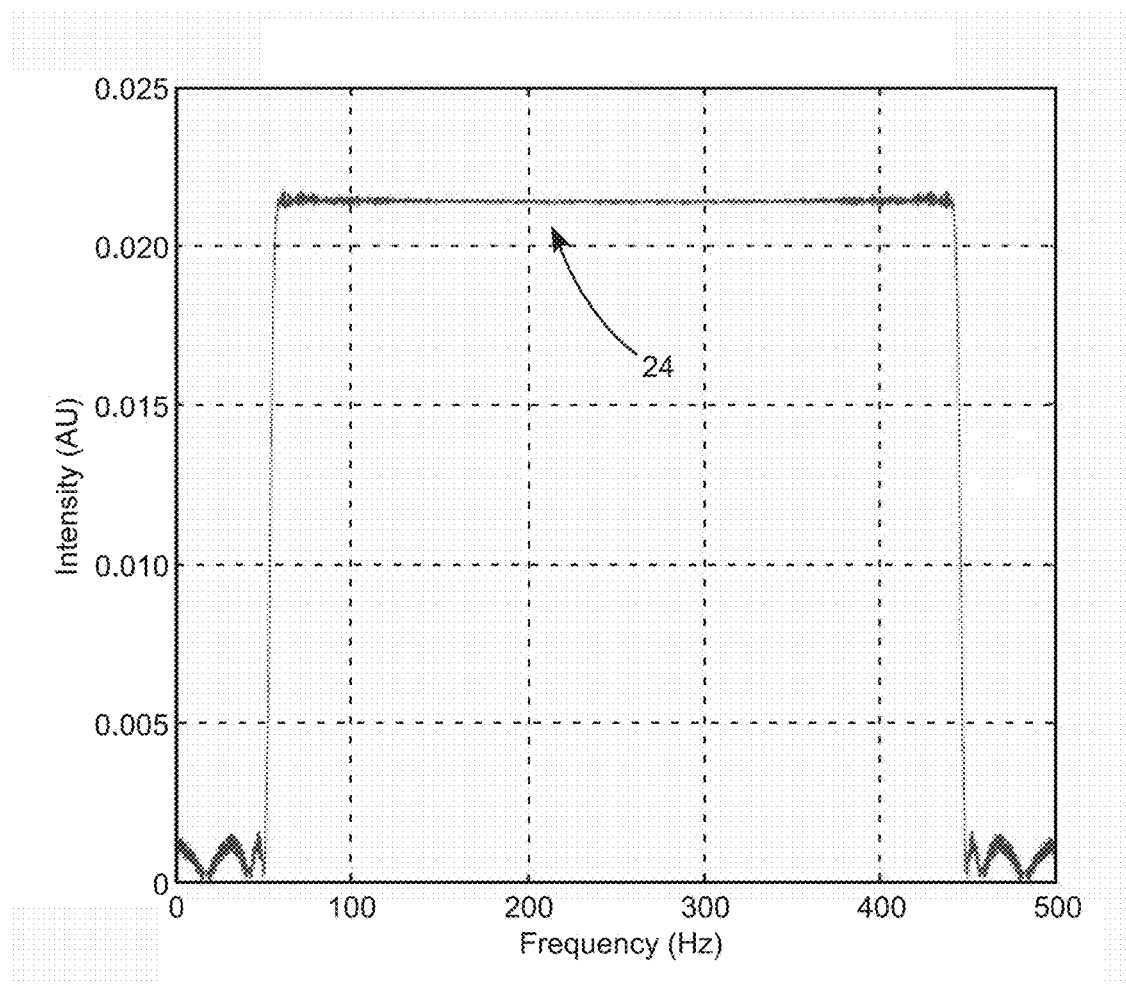
FIG. 7 is a graph schematically illustrating a fast Fourier transform spectrum of the pulse-energy fluctuations of FIG. 6, graphically depicting pulse-energy instability as a function of frequency.

FIG. 7 is a graph schematically illustrating the intensity of a FFT spectrum (curve 24) for the pulse-energy fluctuations of graph of FIG. 6. This graph depicts pulse-energy instability as a function of frequency resulting from the high-pass digital filtering. It can be seen that the pulse-energy instability at frequencies less than 60 Hz and greater than 440 Hz is substantially reduced. This is achieved, however, at the expense of a substantial increase in pulse-energy instability at the other frequencies. Here, it should be noted that the symmetry of curve 24 is a feature of the FFT spectral representation.

Figure 8:
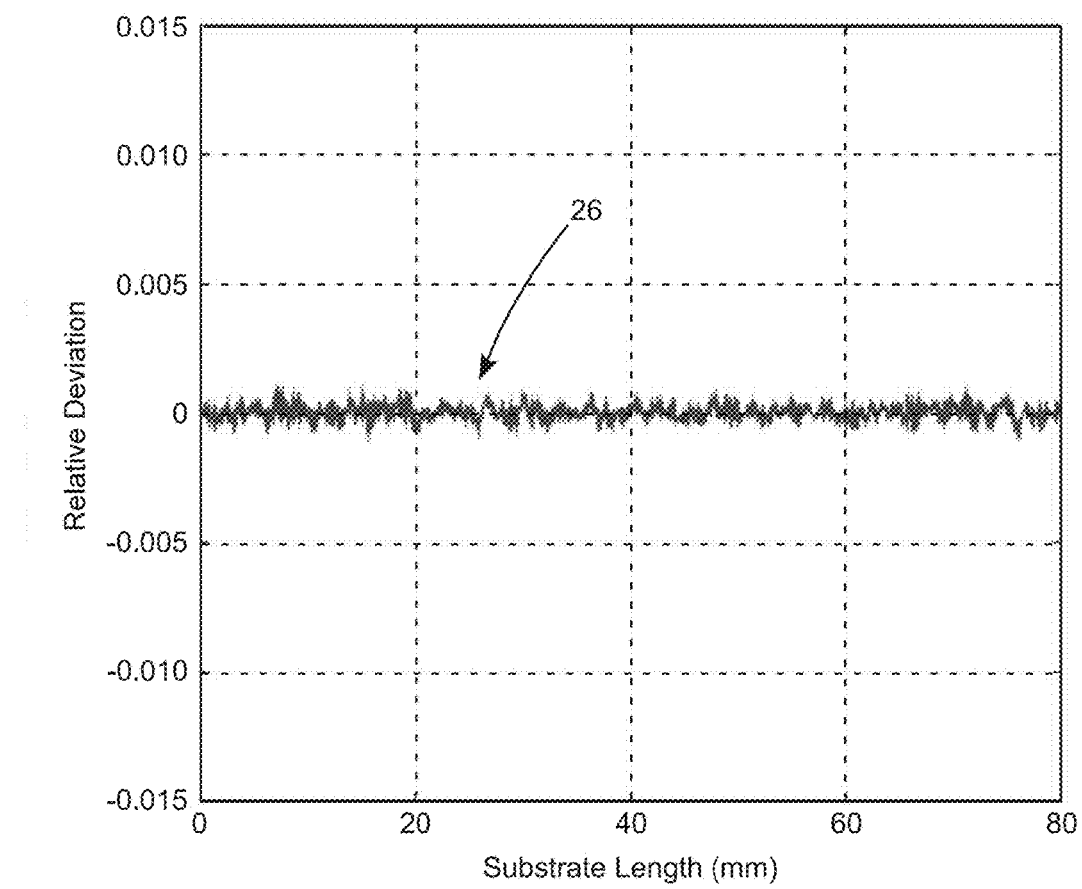
FIG. 8 is a graph of relative variation of energy dose as a function of length along the substrate for the relative pulse-energy fluctuations of FIG. 6 for the laser controlled by the high-pass digital filtering method, with laser pulses having the intensity profile of FIG. 1A delivered in the overlapping manner of FIG. 1B.

FIG. 8 is a graph schematically illustrating variation of energy dose as a function of length along the substrate (curve 26), delivered by the hypothetical laser controlled by the high-pass digital filtering method of the present invention. This graph was generated from the pulse-energy fluctuations of FIG. 6, using the above-described assumptions used to generate the graph of FIG. 4 for the prior-art unfiltered example. It can be seen that the energy-dose variations are dramatically reduced compared with those of the prior-art example of FIG. 2. Energy-dose variation on the substrate is more than a factor of 5 improved over the prior-art example, even though the pulse-energy instability of the laser output is about two-times worse.

Figure 9:
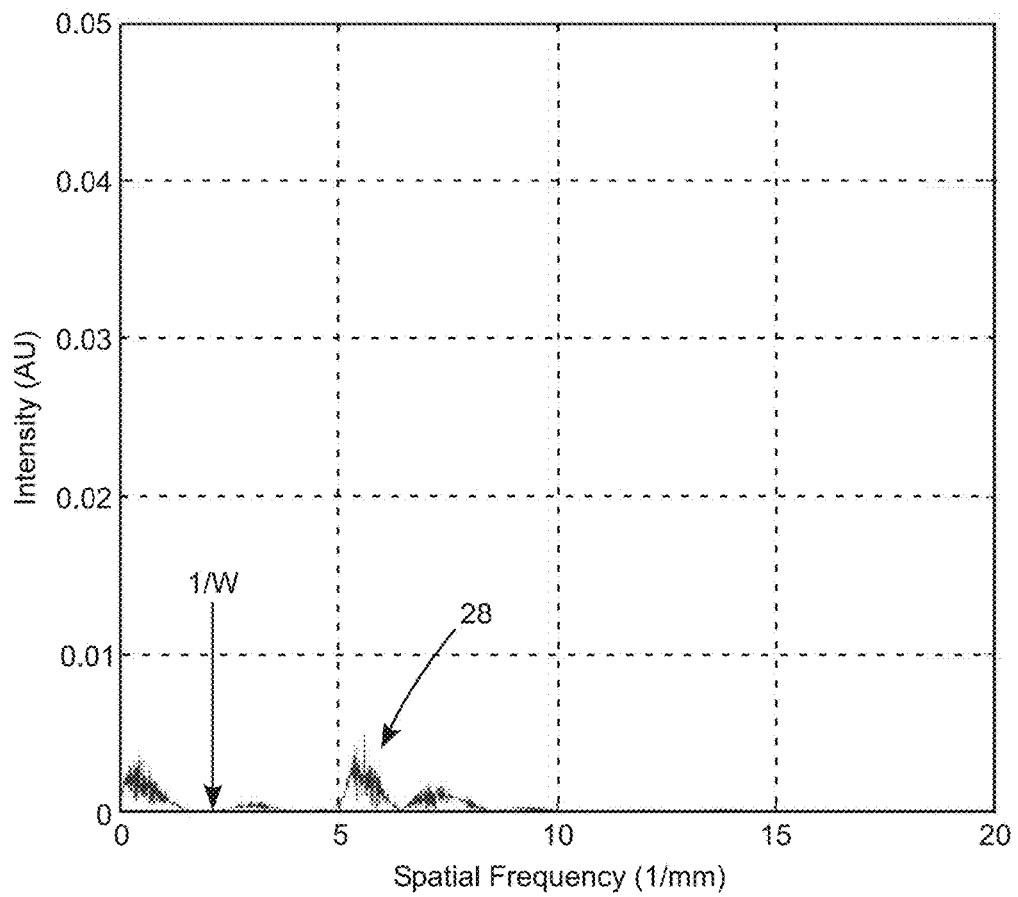
FIG. 9 is a graph schematically illustrating a fast Fourier transform spectrum of the relative energy-dose variations of FIG. 8, graphically depicting energy-dose variation on the substrate as a function of spatial frequency.

FIG. 9 is a graph schematically illustrating the intensity of a FFT spectrum (curve 28) for the energy-dose variation of FIG. 8. This graph depicts the instability of energy-dose as a function of spatial frequency resulting from the high-pass digital filtering. It can be seen that at spatial frequencies less than about 5/mm the intensity is substantially reduced, as intended.

It should be noted here, while high-pass digital filtering is described above as being performed with an elliptical filter of the sixth order, other high-pass filters may be used without departing from the spirit and scope of the present invention. Other possible filters include Chebyshev type 1, Chebyshev type 2, and Butterworth filters. Similar filters, including adaptive filters, may be used alone or in combination.

Figure 10:
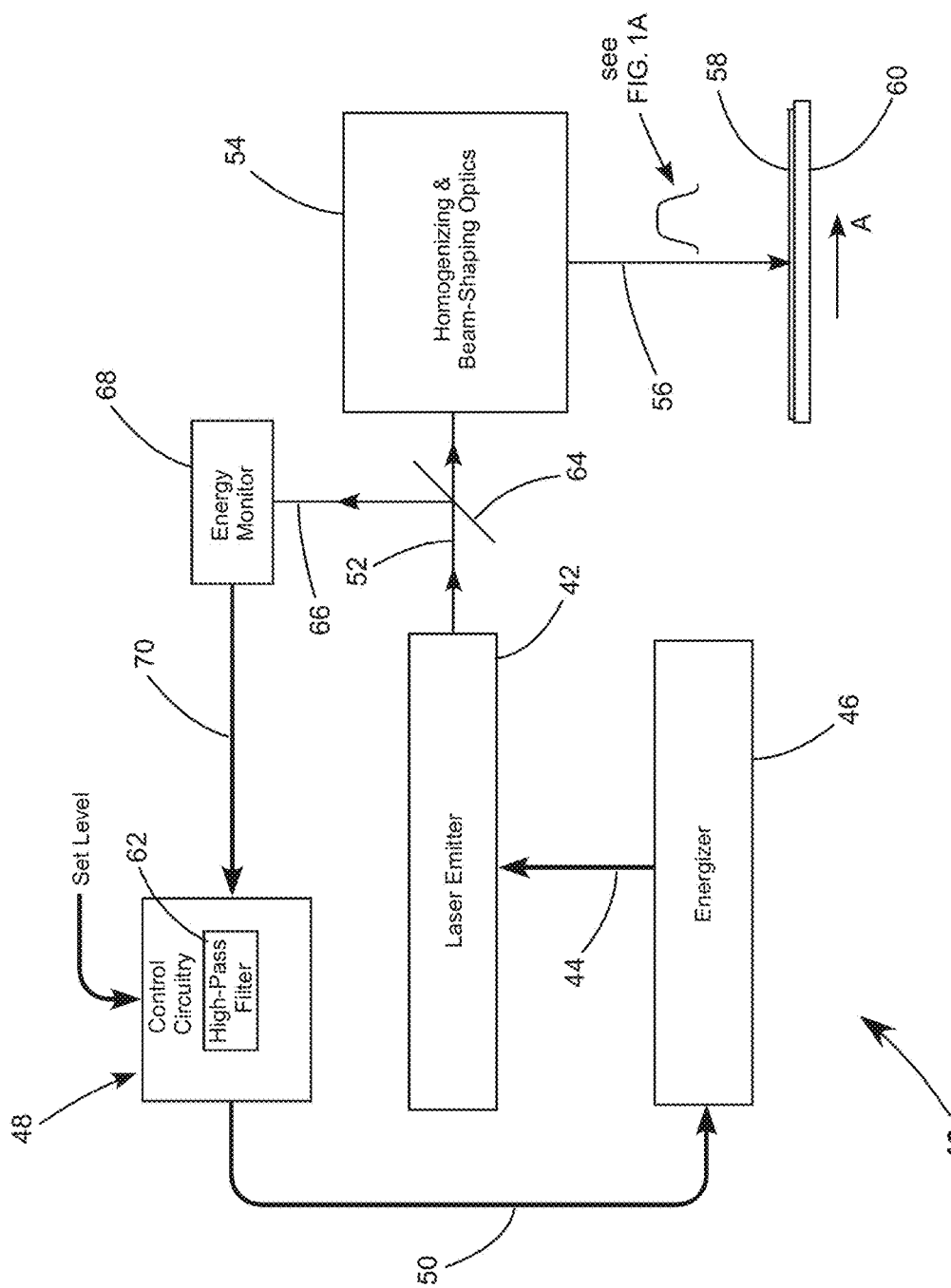
FIG. 10 schematically illustrates a preferred embodiment of excimer-laser annealing apparatus in accordance with the present invention, configured to implement the high-pass-filter energy-control method of FIG. 6 in the excimer-laser crystallization process of FIG. 1A and FIG. 1B.

FIG. 10 schematically illustrates a preferred embodiment 40 of excimer-laser annealing apparatus in accordance with the present invention configured to implement the high-pass-filter energy-control method of FIG. 6 in the excimer-laser crystallization process of FIGS. 1A and 1B. In the drawing, optical-beam paths are designated by fine lines and electrical paths are designated by bold lines. Only such detail is provided for understanding principles of the present invention discussed above. General details of excimer lasers are well known in the art and a detailed description thereof is not presented herein. See for example, U.S. Pat. No. 6,727,731 and U.S. Patent Application No. 20130034118, each of which is incorporated herein by reference.

Apparatus 40 includes a gas-discharge (excimer) laser-emitter 42 for generating laser pulses. Laser-emitter 42 has discharge electrodes and resonator optics (not shown). The discharge electrodes are energized by electrical pulses 44 generated by an energizer 46. Energizer 46 has pulse-forming and pulse-compression circuitry (not shown). Control circuit 48 regulates the electrical pulse-energy generated by the energizer and delivered to the discharge electrodes. In particular, control circuit 48 regulates the voltage generated by the energizer for electrically charging the discharge electrodes. The voltage regulation is through a control signal 50.

Control circuit 48 attempts to maintain the laser output at a preferred set energy level for the crystallization process. The set energy level can be supplied manually to the control circuit as a predetermined level or can be supplied periodically from a process monitor (not shown). The process monitor determines the required set energy level by evaluating the silicon layer and substrate being processed by apparatus 40.

In response to electrical pulses from energizer 46, laser-emitter 42 delivers a train of laser-pulses along a beam-path 52 at a desired PRF. A preferred range for the PRF is 300 Hz to 600 Hz. A most preferred range for the PRF is 450 Hz to 600 Hz. The laser-pulses are delivered to homogenizing and beam-shaping optics 54, which cause the laser-pulses to have the short-axis intensity profile depicted in FIG. 1A. These laser pulses are delivered along an incident beam-path 56 to a silicon layer 58 supported on a substrate 60. The substrate is translated with respect to incident beam-path 56 in the direction indicated by arrow A. The translation-speed is selected consistent with the PRF of the laser-pulses, to create the overlapping pulse arrangement of FIG. 1B.

Control circuit 48 includes a digital filter 62, which is depicted in FIG. 10 as a discrete entity, for convenience of illustration. In practice, digital filter 62 is integrated into control circuit 48. A beam-splitter 64 directs a portion of each laser-pulse along a beam path 66 to an energy monitor 68. For example, the portion could be about 3%. Energy monitor 68 measures the energy of each laser-pulse and supplies the measured energy value 70 to control circuit 48. Knowing the measured energy value 70 of prior pulses and any prior adjustments to control signal 50, control circuit 48 and digital filter 62 therein adjust control signal 50 for a next laser-pulse to minimize the pulse-energy fluctuations below a predetermined frequency for the train of laser-pulses. The predetermined frequency is less than the PRF of pulses delivered by laser-emitter 42.

As pointed out herein above, adjustment of control signal 50 using digital filter 62 increases pulse-energy fluctuations above the predetermined frequency. However, control circuit 48 still maintains the average energy of the laser-pulses at the set energy level. In addition, the spatial overlapping of consecutive laser-pulses still averages the overall irradiation at each location on the substrate and thereby mitigates any impact on the crystallization process of increased pulse-energy fluctuations at higher frequencies.

Keeping in mind that lower temporal frequencies correspond to longer time periods and therefore longer distances along the translation direction, it should be noted that digital filter 62 is not simply a high-pass filter applied to measured energy value 70. Such a high-pass filter would actually eliminate the low-frequency pulse-energy feedback from beam path 52 needed to determine the required adjustment to control signal 50. Nor is digital filter 62 simply a high-pass filter applied to control signal 50. Such a high-pass filter would prevent control circuit 48 from regulating electrical pulses 44 at the low frequencies required to compensate for any slow drift in the output characteristics of energizer 46 or efficiency of laser emitter 42. In contrast, control circuit 48 determines the required adjustment to control signal 50 with full knowledge of the pulse-energies of prior pulses, limited only by the fidelity of energy monitor 68. Control circuit 48 then applies that adjustment in regulating electrical pulses 44, limited only by the agility of energizer 46.

It should also be noted that the required adjustment to control signal 50 is the adjustment required to minimize low-frequency pulse-energy fluctuations and maintain the average pulse-energy at the set energy level, which is different in most instances from the adjustment required to match the pulse-energy of the next pulse to the set energy level. In the simplest implementation of the present invention, described herein above, the adjustment required to minimize low-frequency pulse-energy fluctuations is applied to the next pulse. Those skilled in the art would recognize that more complex implementations are possible, without departing from the spirit and scope of the present invention. For example, applying the adjustment over a plurality of next laser pulses, In summary, the present invention minimizes low-frequency spatial variations in excimer-laser crystallization processing by minimizing low-frequency pulse-energy fluctuations in the train of laser-pulses delivered to the silicon layer. The present invention is described above with reference to a preferred and other embodiments. The invention is not limited, however, to the embodiments described and depicted herein. Rather, the invention is limited only by the claims appended hereto.

What is claimed is:

1. Apparatus for crystallizing a silicon layer supported on a substrate by delivering a plurality of laser pulses at a pulse-repetition frequency to the silicon layer along an incident beam path while translating the substrate with respect to the incident beam path, the laser pulses having an about flat-topped intensity profile and a width in the translation direction, the pulse-repetition frequency being selected cooperative with the substrate translation such that consecutive laser pulses overlap on the substrate, the apparatus comprising:
    a laser-emitter generating and delivering the laser pulses, the laser pulses each having a pulse-energy;
    homogenizing and beam-shaping optics arranged to receive the laser pulses, cause the laser pulses to have the about flat-topped intensity profile, and deliver the flat-topped laser pulses to the substrate;
    an energizer generating and delivering electrical pulses to the laser-emitter for energizing the laser-emitter, the electrical pulses each having an electrical pulse-energy;
    an energy monitor arranged to measure the pulse-energy of each laser pulse, deliver the measured pulse-energy to a control circuit including a digital filter, the control circuit supplied with a preferred set energy level required for the silicon layer crystallization, the control circuit and digital filter therein arranged to adjust the electrical pulse-energy for a next pulse to maintain the average pulse energy of the laser pulses at the set energy level and to minimize pulse-energy fluctuations of the laser pulses below a predetermined frequency that is less than the pulse-repetition frequency while causing pulse-energy fluctuations above the predetermined frequency to increase.

2. The apparatus of claim 1, wherein the digital filter includes one of an elliptical filter, a Chebyshev type 1 filter, a Chebyshev type 2 filter, and a Butterworth filter.

3. The apparatus of claim 1, wherein the laser-emitter is an excimer laser-emitter.

4. The apparatus of claim 3, wherein the control circuit regulates a voltage generated by the energizer for charging electrodes in the excimer laser-emitter.

5. The apparatus of claim 1, wherein the pulse repetition frequency is in the range of 300 Hertz to 600 Hertz.

6. The apparatus of claim 5, wherein the pulse repetition frequency is in the range of 450 Hertz to 600 Hertz.

7. The apparatus of claim 1, wherein the digital filter is arranged to minimize pulse-energy fluctuations of the laser pulses less than about 60 Hertz.

8. The apparatus of claim 1, wherein the pulses delivered to the silicon layer have a width in the translation direction in the range of 0.4 millimeters to 0.5 millimeters.

9. The apparatus of claim 1, wherein the substrate is translated with respect to the incident beam path at a speed in the range of 5 millimeters-per-second to 10 millimeters-per-second.

10. The apparatus of claim 1, wherein the pulse overlapping is selected such that any location on the substrate is irradiated by between 15 and 25 consecutive pulses.

11. The apparatus of claim 1, further including a process monitor, the set energy level periodically supplied to the control circuit by the process monitor, which evaluates the silicon layer being crystallized.

12. A method for crystallizing a silicon layer supported on a substrate, comprising:
    generating and delivering a plurality of laser pulses using a laser-emitter, the laser pulses having a pulse-repetition frequency, the laser pulses each having a pulse-energy, the laser-emitter energized by electrical pulses generated and delivered by an energizer, the electrical pulses having an electrical pulse energy;
    homogenizing and beam-shaping the laser pulses received from the laser-emitter to cause the laser pulses to have an about flat-topped intensity profile;
    delivering the flat-topped laser pulses to the silicon layer along an incident beam path, while translating the substrate with respect to the incident beam path, the laser pulses having a width in the translation direction, the pulse-repetition rate being selected cooperative with the substrate translation such that consecutive laser pulses overlap on the substrate;
    measuring the pulse-energy of each laser pulse;
    delivering the measured pulse-energy to a control circuit including a digital filter, the control circuit supplied with a preferred set energy level required for the silicon layer crystallization;
    adjusting the electrical pulse energy for a next laser pulse to maintain the average pulse-energy of the laser pulses at the set energy level and to minimize pulse-energy fluctuations of the laser pulses below a predetermined frequency that is less than the pulse-repetition frequency while causing pulse-energy fluctuations above the predetermined frequency to increase.

13. The method of claim 12, wherein the adjusting is performed using one of an elliptical filter, a Chebyshev type 1 filter, a Chebyshev type 2 filter, and a Butterworth filter.

14. The method of claim 12, wherein the laser-emitter is an excimer laser-emitter.

15. The method of claim 14, wherein the control circuit regulates a voltage generated by the energizer for charging electrodes in the excimer laser-emitter.

16. The method of claim 12, wherein the pulse repetition frequency is in the range of 450 Hertz to 600 Hertz.

17. The method of claim 12, wherein the digital filter is arranged to minimize pulse-energy fluctuations of the laser pulses less than about 60 Hertz.

18. The method of claim 12, wherein the pulses delivered to the silicon layer have a width in the translation direction in the range of 0.4 millimeters to 0.5 millimeters.

19. The method of claim 12, wherein the substrate is translated with respect to the incident beam at a speed in the range of 5 millimeters-per-second to 10 millimeters-per-second.

20. The method of claim 12, wherein the pulse overlapping is selected such that any location on the substrate is irradiated by between 15 and 25 consecutive pulses.

* * * * *